(12) United States Patent
Wang (10) Patent No.: US 10,446,104 B2
(45) Date of Patent: Oct. 15, 2019

(54) SHIFT REGISTER UNIT, GATE LINE DRIVING DEVICE, AND DRIVING METHOD

(71) Applicants: BOE TECHNOLOGY GROUP CO., LTD., Beijing (CN); BEIJING BOE DISPLAY TECHNOLOGY CO., LTD., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 210 days.

(21) Appl. No.: 15/518,389

(22) PCT Filed: Sep. 30, 2016

(86) PCT No.: PCT/CN2016/101109
§ 371 (c)(1),
(2) Date: Apr. 11, 2017

(87) PCT Pub. No.: WO2017/059792
PCT Pub. Date: Apr. 13, 2017

(65) Prior Publication Data
US 2017/0316751 A1    Nov. 2, 2017

(30) Foreign Application Priority Data

Oct. 8, 2015    (CN) .......................... 2015 1 0647045

(51) Int. Cl.
*G11C 19/00*    (2006.01)
*G09G 3/36*    (2006.01)
(Continued)

(52) U.S. Cl.
CPC ......... *G09G 3/3685* (2013.01); *G09G 3/3677* (2013.01); *G11C 7/1036* (2013.01);
(Continued)

(58) Field of Classification Search
None
See application file for complete search history.

(56) References Cited

U.S. PATENT DOCUMENTS

2008/0219401 A1* 9/2008 Tobita .................. G09G 3/3677
377/79
2009/0040161 A1    2/2009 Baek et al.
(Continued)

FOREIGN PATENT DOCUMENTS

| CN | 101364391 A | 2/2009 |
| CN | 102598144 A | 7/2012 |

(Continued)

OTHER PUBLICATIONS

The International Search Report and Written Opinion dated Nov. 28, 2016; PCT/CN2016/101109.
(Continued)

*Primary Examiner* — Tuan T Lam (57) ABSTRACT

A shift register unit, a gate line driving device includes multiple stages of the shift register units, and a driving method for being applied to the shift register unit; the shift register unit includes: an input module connected between an input terminal and a pull-up node, and configured to charge the pull-up node; an output module connected between the pull-up node, a first clock signal terminal and an output terminal, and configured to output to the output terminal a first clock signal received at the first clock signal terminal; a pull-up node reset module connected between a reset terminal, a pull-down node and the pull-up node, and configured to reset the pull-up node; and an output reset module connected between a second clock signal terminal, the pull-down node and the output terminal, and configured to reset the output terminal.

16 Claims, 8 Drawing Sheets

(51) Int. Cl.
- *G11C 7/10* (2006.01)
- *G11C 19/28* (2006.01)
- *G11C 19/30* (2006.01)
- *G11C 29/00* (2006.01)
- *G11C 19/18* (2006.01)
- *G11C 29/02* (2006.01)

(52) U.S. Cl.
CPC ............ *G11C 19/18* (2013.01); *G11C 19/184* (2013.01); *G11C 19/28* (2013.01); *G11C 19/287* (2013.01); *G11C 19/30* (2013.01); *G11C 29/86* (2013.01); *G09G 2310/0283* (2013.01); *G09G 2310/0286* (2013.01); *G11C 29/022* (2013.01)

(56) References Cited

U.S. PATENT DOCUMENTS

| | | |
|---|---|---|
| 2010/0214206 A1 | 8/2010 | Yokoyama et al. |
| 2012/0194489 A1 | 8/2012 | Iwamoto et al. |
| 2012/0200544 A1 | 8/2012 | Iwamoto et al. |
| 2014/0098015 A1* | 4/2014 | Wang ............... G09G 3/3677 345/100 |
| 2014/0176410 A1* | 6/2014 | Ma .................... G09G 3/3622 345/92 |
| 2015/0187313 A1 | 7/2015 | Lee |
| 2015/0206495 A1 | 7/2015 | Xu |
| 2015/0255031 A1 | 9/2015 | Cao et al. |
| 2015/0302935 A1* | 10/2015 | Zeng .................. G09G 3/20 377/64 |
| 2017/0092376 A1 | 3/2017 | Wang |
| 2017/0186393 A1 | 6/2017 | Wang |

FOREIGN PATENT DOCUMENTS

| | | |
|---|---|---|
| CN | 102598145 A | 7/2012 |
| CN | 103489484 A | 1/2014 |
| CN | 103761949 A | 4/2014 |
| CN | 104658505 A | 5/2015 |
| CN | 104700812 A | 6/2015 |
| CN | 104700814 A | 6/2015 |
| CN | 104715733 A | 6/2015 |
| CN | 104851382 A | 8/2015 |
| CN | 104934009 A | 9/2015 |
| CN | 105185339 A | 12/2015 |
| CN | 204966019 U | 1/2016 |
| KR | 101182770 B1 | 9/2012 |
| KR | 1020140049754 A | 4/2014 |

OTHER PUBLICATIONS

The First Chinese Office Action dated Apr. 5, 2017; Appln. No. 201510647045.2.

Extended European Search Report dated Mar. 4, 2019; Appln. No. 16852863.6.

\* cited by examiner

Prior Art

SHIFT REGISTER UNIT, GATE LINE DRIVING DEVICE, AND DRIVING METHOD

TECHNICAL FIELD

The present disclosure relates to the technical field of display technology, and more particularly to a shift register unit, a gate line driving device comprising the shift register unit, and a driving method for being applied to the shift register unit.

BACKGROUND

In the field of display technology, an array of pixels of a liquid crystal display typically includes a plurality of rows of gate lines and a plurality of columns of data lines crossed with each other, wherein driving of the gate lines can be implemented through an attached integrated driving circuit. In recent years, with continuous development of the amorphous silicon thin film manufacturing process, a gate driving circuit can also be integrated on a thin film transistor array substrate so as to form a GOA (Gate driver On Array) for driving the gate lines.

A plurality of shift register units can be adopted to form the GOA to provide a switching signal to a plurality of rows of gate lines of a pixel array, so as to control the plurality of rows of gate lines to be turned on sequentially, and the data lines apply display data signals to pixels in the corresponding rows in the pixel array, so as to form grayscale voltages required to display respective gray scales of an image, and then each frame of the image is displayed.

In an existing gate line driving device, after the shift register unit in a current stage completes its output, in order to reset an output terminal of the shift register unit in the current stage, an output signal from an shift register unit in a next stage is typically taken as a reset signal for the shift register unit in the current stage to control a pull-down transistor, so as to reset the output terminal of the shift register unit in the current stage. However, the transistor that pulls down the output terminal of the shift register unit usually has a large size and a low use efficiency, which is inimical to circuit downsizing and power consumption reducing. Meanwhile, resetting of the shift register unit in a previous stage and triggering of the shift register unit in a next stage are both completed through a signal outputted from an output transistor of the shift register unit in the current stage, thus the output transistor of the shift register unit in the current stage has a large load, which results in a signal output delay. In addition, if the output transistor has a failure, not only a poor signal output would be generated in the gate line corresponding to the current stage, but also an output failure would occur in the gate lines in the previous stage and the next stage.

SUMMARY

In view of the above, the present disclosure provides a shift register unit, a gate line driving device comprising multiple stages of the shift register units, and a driving method, which can downsize an overall structure of the GOA, reduce power consumption, decrease signal delay, improve signal waveform, and also enhance reliability of the GOA circuit in entirety.

According to an aspect of the present disclosure, there is provided a shift register unit, comprising: an input module connected between an input terminal and a pull-up node, and configured to charge the pull-up node when a trigger signal from a previous stage is received at the input terminal; an output module connected between the pull-up node, a first clock signal terminal and an output terminal, and configured to output a first clock signal received at the first clock signal terminal to the output terminal under control of the pull-up node; a pull-up node reset module connected between a reset terminal, a pull-down node and the pull-up node, and configured to reset the pull-up node under control of a reset signal inputted at the reset terminal or a level at the pull-down node; and an output reset module connected between a second clock signal terminal, the pull-down node and the output terminal, and configured to reset the output terminal under control of a second clock signal received at the second clock signal terminal or a level at the pull-down node.

Optionally, the shift register unit further comprises: a pull-down node level control module connected between the first clock signal terminal, the second clock signal terminal, the pull-down node and the pull-up node, and configured to control a level at the pull-down node under control of at least one of the first clock signal received at the first clock signal terminal, the second clock signal received at the second clock signal terminal, and a level at the pull-up node.

Optionally, the shift register unit further comprises: a trigger module connected between the pull-up node and the first clock signal terminal, and configured to provide a trigger signal to a shift register unit in a next stage.

Optionally, the shift register unit further comprises: a reset signal output module connected between the pull-up node and the first clock signal terminal, and configured to provide a reset signal to a shift register unit in a previous stage.

Optionally, the shift register unit further comprises: an initialization module connected between an initial signal input terminal and the pull-up node, and configured to initialize a level at the pull-up node.

Optionally, in the shift register unit, the input module comprises: a first transistor, a control electrode of the first transistor being connected to the input terminal, a first electrode of the first transistor being connected to a first level input terminal, and a second electrode of the first transistor being connected to the pull-up node.

Optionally, in the shift register unit, the output module comprises: a second transistor, a control electrode of the second transistor being connected to the pull-up node, a first electrode of the second transistor being connected to the first clock signal terminal, and a second electrode of the second transistor being connected to the output terminal; and a capacitor connected in parallel with a gate and a source of the second transistor.

Optionally, in the shift register unit, the pull-up node reset module comprises: a third transistor, a control electrode of the third transistor being connected to the reset terminal, a first electrode of the third transistor being connected to the pull-up node, and a second electrode of the third transistor being connected to a second level input terminal; and a fourth transistor, a control electrode of the fourth transistor being connected to the pull-down node, a first electrode of the fourth transistor being connected to the pull-up node, and a second electrode of the fourth transistor being connected to the second level input terminal.

Optionally, in the shift register unit, the output reset module comprises: a fifth transistor, a control electrode of the fifth transistor being connected to the second clock signal terminal, a first electrode of the fifth transistor being connected to the output terminal, and a second electrode of the fifth transistor being connected to the second level input terminal; and a sixth transistor, a control electrode of the sixth transistor being connected to the pull-down node, a first electrode of the sixth transistor being connected to the output terminal, and a second electrode of the sixth transistor being connected to the second level input terminal.

Optionally, in the shift register unit, the pull-down node level control module comprises: a seventh transistor, a control electrode of the seventh transistor being connected to a first electrode of the seventh transistor and further to the second clock signal terminal; an eighth transistor, a control electrode of the eighth transistor being connected to the pull-up node, a first electrode of the eighth transistor being connected to the second level input terminal, and a second electrode of the eighth transistor being connected to a second electrode of the seventh transistor; a ninth transistor, a control electrode of the ninth transistor being connected to the second electrode of the seventh transistor, a first electrode of the ninth transistor being connected to the second clock signal terminal, and a second electrode of the ninth transistor being connected to the pull-down node; a tenth transistor, a control electrode of the tenth transistor being connected to the pull-up node, a first electrode of the tenth transistor being connected to the pull-down node, and a second electrode of the tenth transistor being connected to the second level input terminal; and an eleventh transistor, a control electrode of the eleventh transistor being connected to the first clock signal terminal, a first electrode of the eleventh transistor being connected to the second level input terminal, and a second electrode of the eleventh transistor being connected to a gate of the ninth transistor.

Optionally, in the shift register unit, the trigger module comprises: a twelfth transistor, a control electrode of the twelfth transistor being connected to the pull-up node, a first electrode of the twelfth transistor being connected to the first clock signal terminal, and a second electrode of the twelfth transistor being connected to a trigger signal output terminal.

Optionally, in the shift register unit, the reset signal output control module comprises: a thirteenth transistor, a control electrode of the thirteenth transistor being connected to the pull-up node, a first electrode of the thirteenth transistor being connected to the first clock signal terminal, and a second electrode of the thirteenth transistor being connected to the reset signal output terminal.

Optionally, in the shift register unit, the initialization module comprises: a fourteenth transistor, a control electrode of the fourteenth transistor being connected to the initial signal input terminal, a first electrode of the fourteenth transistor being connected to the pull-up node, and a second electrode of the fourteenth transistor being connected to the second level input terminal.

According to another aspect of the present disclosure, there is provided a gate line driving device, comprising a plurality of the shift register units as described above cascaded in multiple stages, wherein an output terminal of the shift register unit in each stage is connected to one corresponding gate line; wherein the first clock signal terminal and the second clock signal terminal of the shift register unit in an odd-numbered stage are connected to the first clock signal and the second clock signal, respectively; the trigger signal output terminal of the shift register unit in the odd-numbered stage is connected to an input terminal of the shift register unit in a next odd-numbered stage with one stage therebetween, the reset signal output terminal of the shift register unit in the odd-numbered stage is connected to a reset terminal of the shift register unit in a previous even-numbered stage with two stages therebetween; the first clock signal terminal and the second clock signal terminal of the shift register unit in an even-numbered stage are connected to the third clock signal and the fourth clock signal, respectively; the trigger signal output terminal of the shift register unit in the even-numbered stage is connected to the input terminal of the shift register unit in a next even-numbered stage with one stage therebetween: the reset signal output terminal of the shift register unit in the even-numbered stage is connected to the reset terminal of the shift register unit in a previous odd-numbered stage with two stages therebetween. Periods of the first clock signal, the second clock signal, the third clock signal, and the fourth clock signal are the same, the timing of the first clock signal and that of second clock signal are opposite, and the timing of the third clock signal and that of the fourth clock signal are opposite, and the third clock signal lags behind the first clock signal by a quarter of the period.

According to yet another aspect of the present disclosure, there is provided a driving method for being applied to the shift register unit described above, comprising: inputting an active level to the input terminal, and charging the pull-up node to be at a first high level; inputting a high level to the first clock signal terminal, and turning on the output module by the pull-up node, and outputting a first clock signal at a high level to a gate line, so that a level at the pull-up node is increased from the first high level to a second high level through bootstrap effect of the capacitor; inputting a low level to the first clock signal terminal, and maintaining the output module to be on, and outputting a first clock signal at a low level to the gate line, so that the level at the pull-up node is decreased from the second high level to the first high level through the coupling of the capacitor; inputting an active reset level to the reset terminal, discharging the pull-up node to be at a low level, and turning off the output module; and charging the pull-down node by the high level inputted from the second clock signal terminal, and turning on the pull-down node level control module to pull down the pull-up node and the output terminal to be at a low level, respectively.

In the shift register unit, the gate line driving device, and the corresponding driving method according to the embodiments of the present disclosure, the resetting of the pull-up node is delayed, and the turn-on time of the output transistor is extended; thus, the low level clock signal outputted during the extended turn-on time of the output transistor can be adopted to perform the pull-down control on the signal at the gate line, removing the large-size transistor dedicated to pull down the output terminal; the driving signal provided to the gate line corresponding to the shift register unit in the current stage is separated from the trigger signal provided to the shift register unit in the next stage and/or a reset signal provided to the shift register unit in the previous stage, so that the signal delay is reduced, the signal waveform is improved, and the affect, which is due to the failure occurring in the output transistor in the shift register unit in the current stage, over the entire gate driving device is decreased, enhancing the circuit reliability; meanwhile, when a failure occurs in the output transistor in the shift register unit in the current stage, it is easy to locate a point of failure according to the malfunction in the scanning of a corresponding gate line.

BRIEF DESCRIPTION OF THE DRAWINGS

In order to more clearly illustrate the technical solutions of the embodiments of the present disclosure, hereinafter, the drawings necessary for illustration of the embodiments of the present application will be introduced briefly; obviously, the drawings described below are only some embodi

DETAILED DESCRIPTION OF THE EMBODIMENTS

Hereinafter, technical solutions in the embodiments of the present disclosure will be described clearly and comprehensively in combination with the drawings. Obviously, these described embodiments are merely parts of the embodiments of the present disclosure, rather than all of the embodiments thereof. Other embodiments obtained by a person of ordinary skill in the art based on the embodiments of the present disclosure without paying creative effort all fall into the protection scope of the present disclosure.

Figure 1:
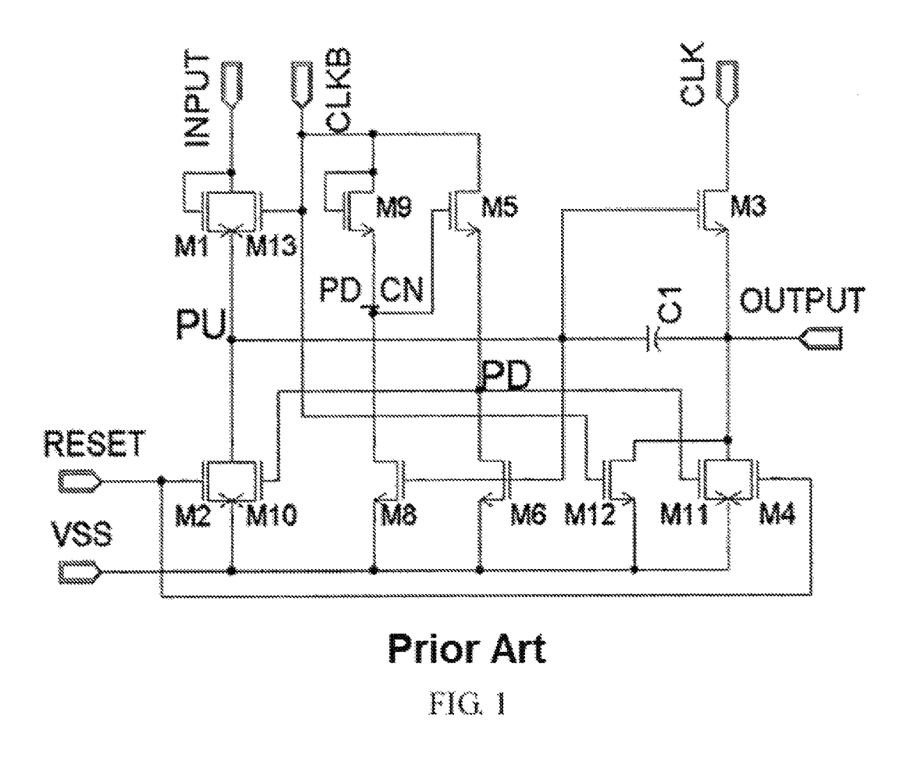
- FIG. 1 illustrates a circuit structure of a known shift register unit.

FIG. 1 illustrates a circuit structure of a known shift register unit. As illustrated in FIG. 1, the shift register unit comprises: an input transistor M1, a gate and a drain of the input transistor M1 being connected together and connected to an input terminal of the shift register unit, and a source of the input transistor M1 being connected to a pull-up node PU; an output transistor M3, a gate of the output transistor M3 being connected to the pull-up node PU, a drain of the output transistor M3 being connected to a first clock signal CLK, and a source of the output transistor M3 being connected to an output terminal of the shift register unit; a capacitor C1 connected in parallel between the gate and the source of the output transistor M3; a pull-up node reset transistor M2, a gate of the pull-up node reset transistor M2 being connected to a reset terminal of the shift register unit, a drain of the pull-up node reset transistor M2 being connected to the pull-up node, and a source of the pull-up node reset transistor M2 being connected to a low level input terminal VSS; an output reset transistor M4, a gate of the output reset transistor M4 being connected to the reset terminal of the shift register unit, a drain of the output reset transistor M4 being connected to the output terminal of the shift register unit, and a source of the output reset transistor M4 being connected to the low level input terminal VSS; a pull-up node level control transistor M10, a gate of the pull-up node level control transistor M10 being connected to a pull-down node PD, a drain of the pull-up node level control transistor M10 being connected to the pull-up node PU, and a source of the pull-up node level control transistor M10 being connected to the low level input terminal VSS; output-terminal level control transistors M11 and M12, a gate of the transistor M11 being connected to the pull-down node PD, a drain of the transistor M11 being connected to the output terminal of the shift register unit, and a source of the transistor M11 being connected to the low level input terminal VSS; a gate of the M12 being connected to a second clock signal terminal, a drain of the transistor M12 being connected to the output terminal of the shift register unit, and a source of the transistor M12 being connected to the low level input terminal VSS; a transistor M13, a gate of the transistor M13 being connected to the second clock signal terminal, a drain of the transistor M13 being connected to the input terminal of the shift register unit, and a source of the transistor M13 being connected to the pull-up node; a pull-down node control module, comprising transistors M9, M5, M8, and M6, a gate and a drain of the transistor M9 being connected to the second clock signal terminal, and a source of the transistor M9 being connected to a pull-down control node PD_CN; a gate of the transistor M5 being connected to the pull-down control node PD_CN, a drain of the transistor M5 being connected to the second clock signal terminal, and a source of the transistor M5 being connected to the pull-down node PD; a drain of the transistor M8 being connected to the pull-down control node PD_CN, a gate of the transistor M8 being connected to the pull-up node PU, and a source of the transistor M8 being connected to the low level input terminal VSS; a gate of the transistor M6 being connected to the pull-up node PU, a drain of the transistor M6 being connected to the pull-down node PD, and a source of the transistor M6 being connected to the low level input terminal VSS.

Figure 2:
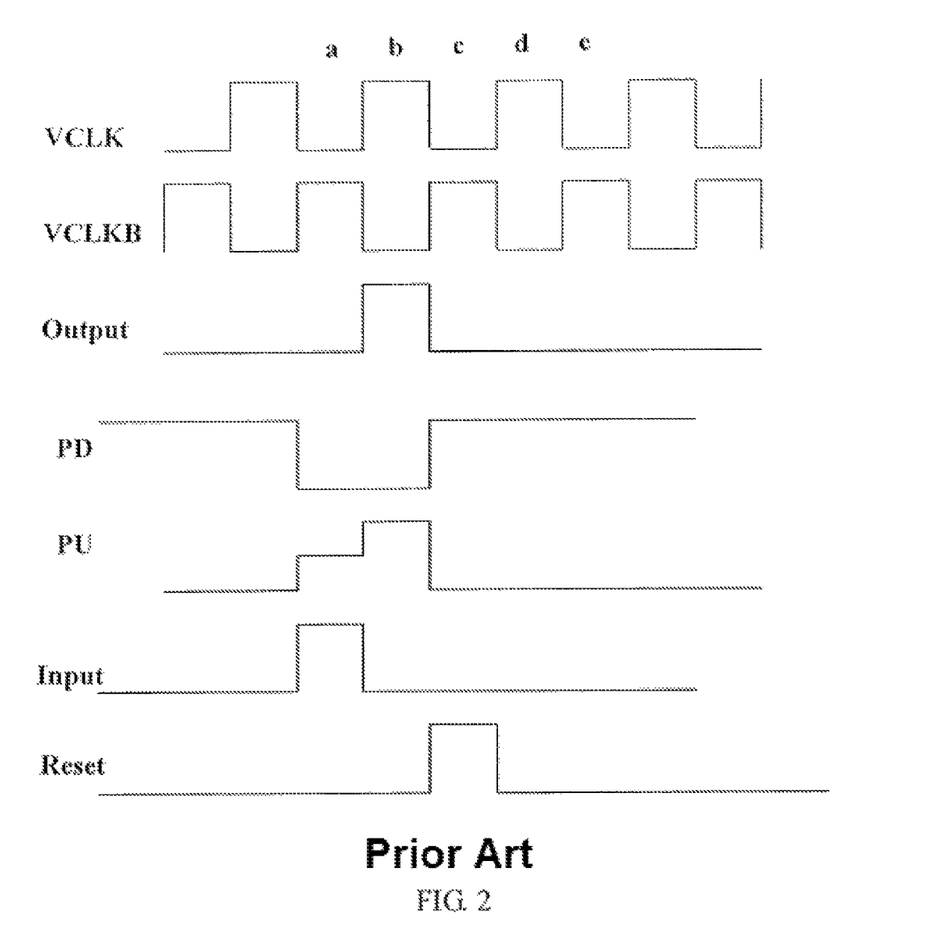
FIG. 2 illustrates timing of relevant signals applicable to the known shift register unit.

Operation principles of the shift register unit illustrated in FIG. 1 will be described below with reference to the signal timing illustrated in FIG. 2. In the five periods indicated by a, b, c, d, and e as illustrated in FIG. 2, the shift register unit performs the following operations:

In a first period a, a low level clock signal VCLK is inputted to the first clock signal terminal, a high level clock signal VCLKB is inputted to the second clock signal terminal, and a high level active input signal is connected to the input terminal INPUT; since a high level is inputted to the input terminal, the transistor M1 is turned on, so that the high level input signal charges the pull-up node PU; since the clock signal VCLKB is at a high level, the transistor M13 is turned on, so that charging process of the pull-up node is accelerated; the pull-up node PU is charged to a first high level; CLKB is at a high level, the transistor M12 is turned on, the output terminal of the shift register unit is pulled down to a low level VSS, which eliminates the noise in the output of the shift register unit; the transistor M9 is turned on to charge the pull-down control node PD_CN, so that the transistor M5 is turned on; since the pull-up node PU is at the first high level, the transistors M6 and M8 are turned on; in the design of transistors, a size ratio of the transistors M8 and M9 can be configured in such way that when M9 and M8 are both turned on, a level at the pull-down control node PD_CN is pulled down to a low level; likewise, a size ratio of the transistor M6 and M5 can be configured in such way that when M5 and M6 are both turned on, a level at the pull-down node is pulled down to a low level, thus ensuring that the transistors M10 and M11 are in a turned-off state in this period;

In a second period b, a high level clock signal VCLK is inputted to the first clock signal terminal, a low level clock signal VCLKB is inputted to the second clock signal terminal, and a low level is connected to the input terminal INPUT; the transistors M1, M13, M9, M5, and M12 are turned off; the output transistor M3 is turned on to output a high level clock signal VCLK; due to the bootstrap effect of the storage capacitor C1, a level at the pull-up node PU is further increased to a second high level, so that the output transistor M3 is turned on more fully; since the pull-up node PU is at a high level, the transistors M8 and M6 continue to be turned on, and the pull-down control node PD_CN and the pull-down node PD are pulled down to VSS, respectively; since the pull-down node PI) is at a low level, the transistors M10 and M11 are maintained in a turned-off state, so that the normal output of a shift signal from the shift register unit cannot be affected;

In a third stage c, a low level clock signal VCLK is inputted to the first clock signal terminal, a high level clock signal VCLKB is inputted to the second clock signal terminal, a low level continues to be connected to the input terminal INPUT, and a high level is connected to the reset terminal; since a high level is connected to the reset terminal, the transistors M2 and M4 are turned on, the pull-up node PU and the output terminal of the shift register unit are pulled down to the low level VSS, respectively; the transistor M1 is turned off, and the transistor M13 is turned on, so that a low level is connected to the pull-up node PU, to discharge the pull-up node PU; the pull-up node PU is discharged to a low level, the transistor M3 is turned off; CLKB is at a high level, and the transistor M12 is turned on, so that the output terminal of the shift register unit is pulled down to the low level VSS, which eliminates the noise in the output of the shift register unit; the transistor M9 is turned on to charge the pull-down control node PD_CN, so that the transistor M5 is turned on to charge the pull-down node PD; since the pull-up node PU is at a low level, the transistors M6 and M8 are turned off; the pull-down node PD is charged to a high level, the transistors M10 and M11 are turned on, and the pull-up node PU and the output terminal of the shift register unit are pulled down to the low level VSS, respectively, which further eliminates the noises that might be generated at the output terminal and the pull-up node of the shift register unit in a non-output period.

In a fourth period d, a high level clock signal VCLK is inputted to the first clock signal terminal, a low level clock signal VCLKB is inputted to the second clock signal terminal, a low level continues to be connected to the input terminal INPUT, and a low level is connected to the reset terminal; the transistors M1, M13, M2, M4, M9, M5, and M12 are turned off: since the pull-up node PU be maintained at a low level, the transistors M6 and M8 continue to be turned off, and the pull-down node PD is at a high level, so that the transistors M10 and M11 are turned on, the pull-up node and the output terminal of the shift register unit are pulled down to the low level VSS, respectively, which eliminates the noises that might be generated at the output terminal and the pull-up node of the shift register unit in a non-output period.

In a fifth period e, a low level clock signal VCLK is inputted to the first clock signal terminal, a high level clock signal VCLKB is inputted to the second clock signal terminal, a low level continues to be connected to the input terminal INPUT, and a low level is connected to the reset terminal; the transistors M1, M2, and M4 are turned off; the transistor M13 is turned on, so that a low level is connected to the pull-up node PU, to discharge the pull-up node PU; the pull-up node PU is discharged to a low level, the transistor M3 is turned off; CLKB is at a high level, and the transistor M12 is turned on, so that the output terminal of the shift register unit is pulled down to the low level VSS, which eliminates the noise in the output of the shift register unit; the transistor M9 is turned on, to charge the pull-down control node PD_CN, so that the transistor M5 is turned on, so as to charge the pull-down node PD; since the pull-up node PU is at a low level, the transistors M6 and M8 are turned off; the pull-down node PD is maintained at a high level, the transistors M10 and M11 are turned on, so that the pull-up node and the output terminal of the shift register unit are pulled down to the low level VSS, respectively, which further eliminates the noises that might be generated at the output terminal and the pull-up node of the shift register unit in a non-output period.

In the shift register unit described above, since the transistor M4 functions only when the shift register unit in the current stage is reset (i.e., when a shift signal is outputted from an adjacent shift register unit in a next stage), and the transistor M4 is turned off in the other periods of the shift register unit in the current stage, its use time is short (it operates only in the period c described above), and its use efficiency is low. In addition, the transistor M4 is very large in size and occupies a lot of space, which results in unreasonable circuit structure, and it is difficult to achieve a narrow bezel for the overall product.

In addition, in the shift register unit described above, while outputting a signal to a gate line corresponding to the current stage, the output transistor M3 outputs a trigger signal for the shift register unit in a next stage and outputs a reset signal for the shift register unit in a previous stage, so that the load of the output transistor M3 is relatively large, which is easy to cause a signal delay; in addition, if the output transistor M3 has a failure, not only a scan failure would occur in a gate line corresponding to the shift register unit in the current stage, meanwhile a failure would occur in the shift register units in the previous stage and the next stage, which directly causes problems to a sequence of scan rows, so that the failure extends in the range and severity.

Figure 3:
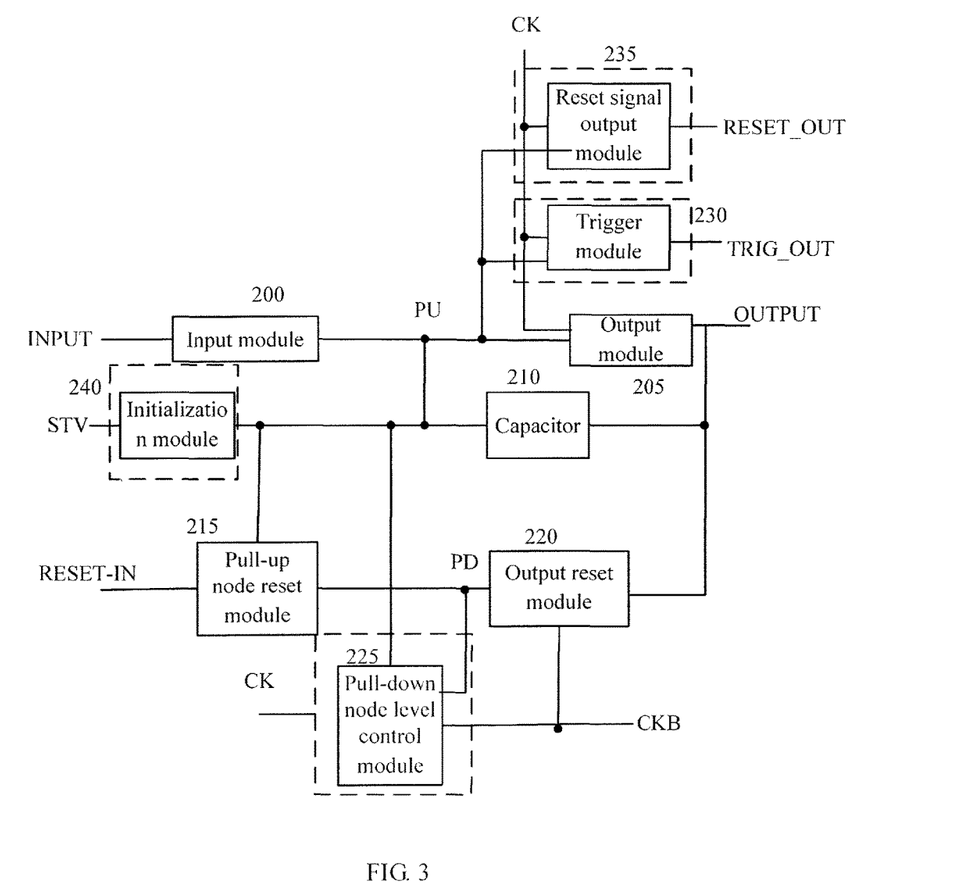
FIG. 3 is a block diagram of a shift register unit according to an embodiment of the present disclosure.

In view of the above, according to an aspect of the present disclosure, there is provided a shift register unit. As illustrated in FIG. 3, the shift register unit comprises: an input module 200 connected between an input terminal and a pull-up node PU, and configured to charge the pull-up node PU when a trigger signal from a previous stage is received at the input terminal; an output module 250 connected between the pull-up node PU, a first clock signal terminal CK and an output terminal, and configured to output a first clock signal at the first clock signal terminal CK to the output terminal under control of the pull-up node PU; a pull-up node reset module 215 connected between a reset terminal RESET-IN, a pull-down node PD and the pull-up node PU, and configured to reset the pull-up node PU under control of a reset signal at the reset terminal RESET-IN or a level at the pull-down node PD; and an output reset module 220 connected between a second clock signal terminal CKB, the pull-down node PD and the output terminal, and configured to reset the output terminal under control of a second clock signal at the second clock signal terminal CKB or a level at the pull-down node PD.

Optionally, as illustrated in FIG. 3, the shift register unit described above further comprises: a pull-down node level control module 225 connected between the first clock signal terminal CK, the second clock signal terminal CKB, the pull-down node PD and the pull-up node PU, and configured to control a level at the pull-down node PD under control of at least one of the first clock signal at the first clock signal terminal CK, the second clock signal at the second clock signal terminal CKB, and a level at the pull-up node PU.

Optionally, as illustrated in FIG. 3, the shift register unit described above further comprises: a trigger module 230 connected between the pull-up node PU and the first clock signal terminal CK, and configured to provide a trigger signal for a shift register unit in a next stage.

Optionally, as illustrated in FIG. 3, the shift register unit described above further comprises: a reset signal output module 235 connected between the pull-up node PU and the first clock signal terminal CK, and configured to provide a reset signal for a shift register unit in a previous stage.

Optionally, as illustrated in FIG. 3, the shift register unit described above further comprises: an initialization module 240 connected between an initial signal input terminal STV and the pull-up node PU, and configured to initialize a level at the pull-up node PU.

In the above-described shift register unit of the present disclosure, a module that provides a trigger signal to the shift register unit in a next stage and/or a module that provides a reset signal to the shift register unit in a previous stage are separated from a module that provides a driving signal to the gate line corresponding to the shift register unit in a current stage, so that the signal delay is reduced, and the affect, which is due to the failure occurring in the output module in the shift register unit in the current stage, over the entire gate driving device is decreased, enhancing the circuit reliability; meanwhile, when a failure occurs in the output module in the shift register unit in the current stage, it is easy to locate a point of failure according to the malfunction in the scanning of a corresponding gate line.

Figure 4:
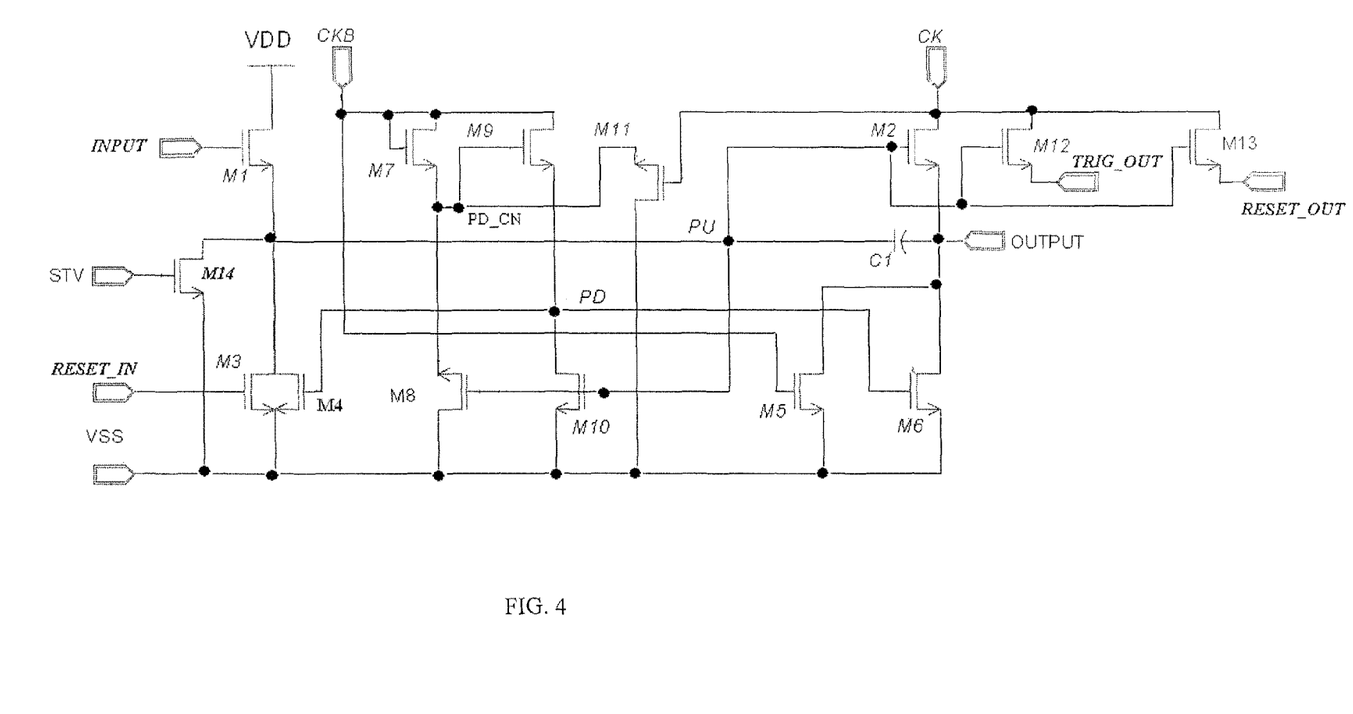
FIG. 4 illustrates a circuit structure of a shift register unit according to an embodiment of the present disclosure.

FIG. 4 illustrates a circuit structure of a shift register unit according to an embodiment of the present disclosure. The circuit structure of the shift register unit will be described in detail below in combination with FIGS. 2 and 4. Optionally, as illustrated in FIG. 4, the input module comprises: a first transistor M1, a control electrode of the first transistor M1 being connected to the input terminal of the shift register unit, a first electrode of the first transistor M1 being connected to a first level input terminal VDD, and a second electrode of the first transistor M1 being connected to the pull-up node PU.

Optionally, as illustrated in FIG. 4, the output module comprises: a second transistor M2, a control electrode of the second transistor M2 being connected to the pull-up node PU, a first electrode of the second transistor M2 being connected to the first clock signal terminal CK, and a second electrode of the second transistor M2 being connected to the output terminal; and a capacitor C1 connected in parallel with a gate and a source of the second transistor M2.

Optionally, as illustrated in FIG. 4, the pull-up node reset module in the shift register unit comprises: a third transistor M3, a control electrode of the third transistor M3 being connected to the reset terminal RESET-IN, a first electrode of the third transistor M3 being connected to the pull-up node PU, and a second electrode of the third transistor M3 being connected to a second level input terminal VSS; and a fourth transistor M4, a control electrode of the fourth transistor M4 being connected to the pull-down node PD, a first electrode of the fourth transistor M4 being connected to the pull-up node PU, and a second electrode of the fourth transistor M4 being connected to the second level input terminal VSS.

Optionally, as illustrated in FIG. 4, the output reset module in the shift register unit comprises: a fifth transistor M5, a control electrode of the fifth transistor M5 being connected to the second clock signal terminal CKB, a first electrode of the fifth transistor M5 being connected to the output terminal, and a second electrode of the fifth transistor M5 being connected to the second level input terminal VSS, and a sixth transistor M6, a control electrode of the sixth transistor M6 being connected to the pull-down node PD, a first electrode of the sixth transistor M6 being connected to the output terminal, and a second electrode of the sixth transistor M6 being connected to the second level input terminal VSS.

Optionally, as illustrated in FIG. 4, the pull-down node level control module in the shift register unit comprises: a seventh transistor M7, a control electrode of the seventh transistor M7 being connected to a first electrode of the seventh transistor M7 and further connected to the second clock signal terminal CKB, a second electrode of the seventh transistor M7 being connected to a pull-down control node PD_CN; an eighth transistor M8, a control electrode of the eighth transistor M5 being connected to the pull-up node PU, a first electrode of the eighth transistor M8 being connected to the second level input terminal VSS, and a second electrode of the eighth transistor M8 being connected to the second electrode of the seventh transistor M7; a ninth transistor M9, a control electrode of the ninth transistor M9 being connected to the second electrode of the seventh transistor M7, a first electrode of the ninth transistor M9 being connected to the second clock signal terminal CKB, and a second electrode of the ninth transistor M9 being connected to the pull-down node PD; a tenth transistor M10, a control electrode of the tenth transistor M10 being connected to the pull-up node PU, a first electrode of the tenth transistor M10 being connected to the pull-down node PD, and a second electrode of the tenth transistor M10 being connected to the second level input terminal VSS; and an eleventh transistor M11, a control electrode of the eleventh transistor M11 being connected to the first clock signal terminal CK, a first electrode of the eleventh transistor M11 being connected to the second level input terminal VSS, and a second electrode of the eleventh transistor M11 being connected to a gate of the ninth transistor M9.

Optionally, as illustrated in FIG. 4, the trigger module in the shift register unit comprises: a twelfth transistor M12, a control electrode of the twelfth transistor M12 being connected to the pull-up node PU, a first electrode of the twelfth transistor M12 being connected to the first clock signal terminal CK, and a second electrode of the twelfth transistor M12 being connected to a trigger signal output terminal.

Optionally, as illustrated in FIG. 4, the reset signal output control module in the shift register unit comprises: a thirteenth transistor M13, a control electrode of the thirteenth transistor M13 being connected to the pull-up node PU, a first electrode of the thirteenth transistor M13 being connected to the first clock signal terminal CK, and a second electrode of the thirteenth transistor M13 being connected to the reset signal output terminal RESET_OUT.

Optionally, as illustrated in FIG. 4, the initialization module in the shift register unit comprises: a fourteenth transistor M14, a control electrode of the fourteenth transistor being connected to the initial signal input terminal STV, a first electrode of the fourteenth transistor being connected to the pull-up node PU, and a second electrode of the fourteenth transistor being connected to the second level input terminal VSS.

Although each of the transistors illustrated in FIG. 4 is an N-type transistor, the control electrode is the gate of the N-type transistor, the first electrode is the drain of the N-type transistor, the second electrode is the source of the N-type transistor; a high level VDD is connected to the first level input terminal, and a low level VSS is connected to the second level input terminal. However, in order to implement the principles of the present disclosure, it is also possible for a P-type transistor to be adopted for one or more of the transistors in the shift register unit described above, only if positions of the source and the drain are adjusted accordingly, and levels connected to the first level input terminal and the second level input terminal are adjusted accordingly, details will not be described here, but they should also be within the protection scope of the present disclosure.

Figure 5:
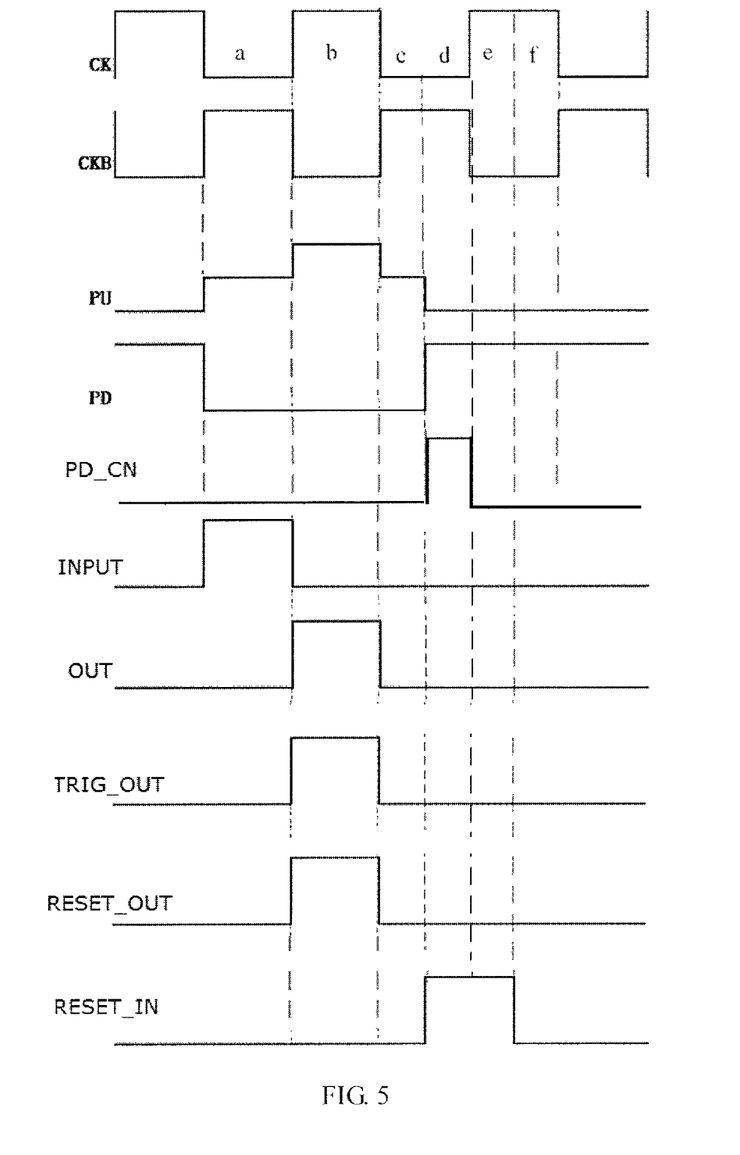
FIG. 5 illustrates timing of relevant signals applicable to the shift register unit according to the embodiment of the present disclosure.
Figure 6A:
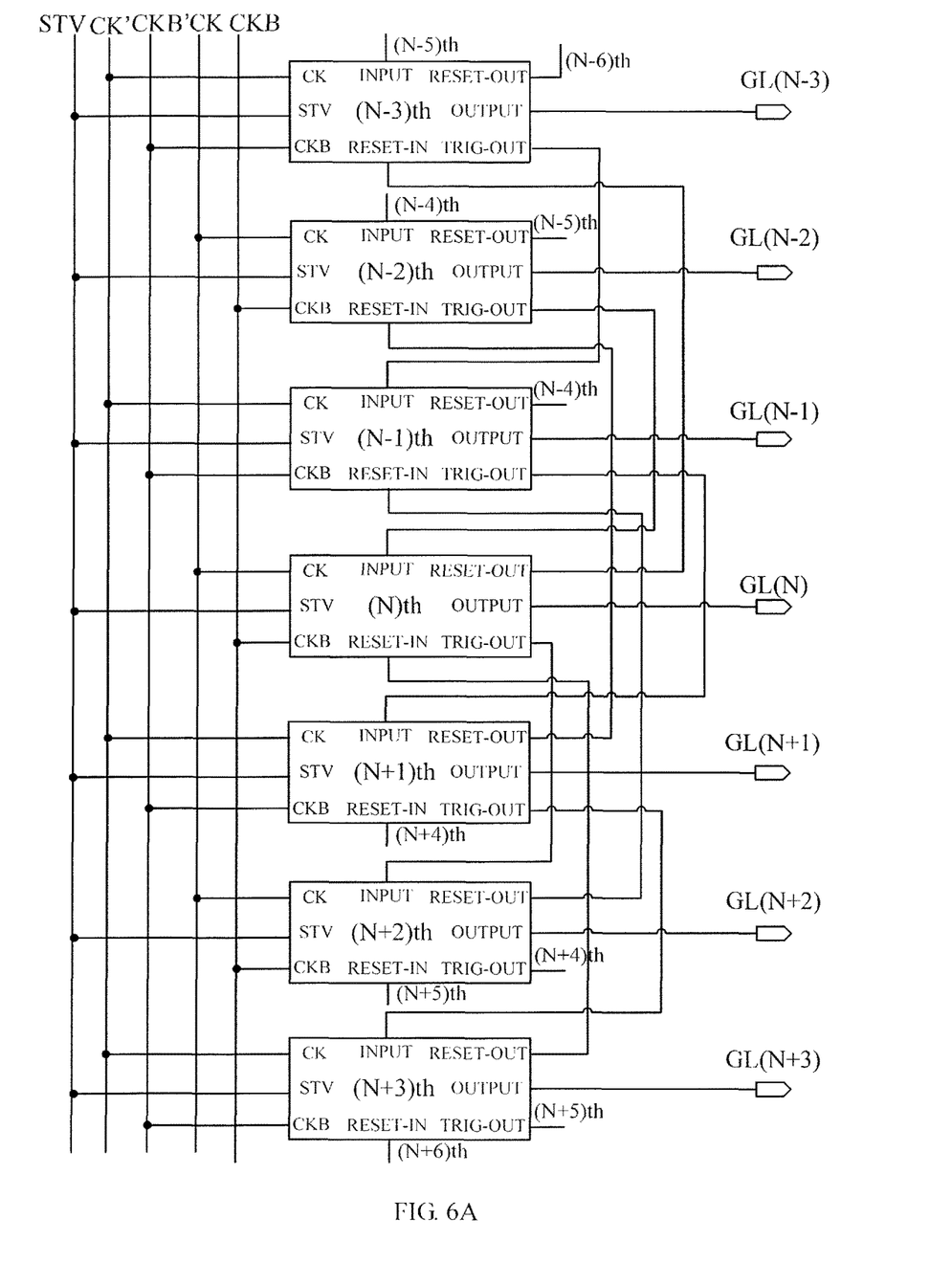
FIG. 6A is a schematic diagram of a overall connection structure of a gate driving device according to an embodiment of the present disclosure.
Figure 6B:
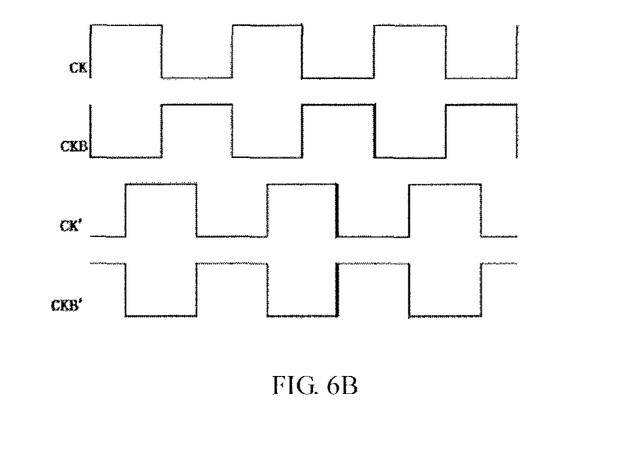
FIG. 6B is a schematic diagram of timing of clock signals applicable to the gate line driving circuit illustrated in FIG. 6A.

By taking the shift register unit illustrated in FIG. 4 as the shift register unit in an Nth stage of the gate line driving device illustrated in FIG. 6, the specific operation principles thereof will be described below with reference to the signal timing illustrated in FIG. 5. The first clock signal terminal of the shift register unit is connected to the first clock signal CK, the second clock signal terminal of the shift register unit is connected to the second clock signal CKB, the input terminal of the shift register unit is connected to a trigger signal output terminal of the shift register unit in a previous stage with one stage therebetween (i.e., the shift register unit in the (N−2)th stage), the trigger signal output terminal of the shift register unit is connected to an input terminal of a shift register unit in a next stage with one stage therebetween (i.e., the shift register unit in the (N+2)th stage), the reset signal output terminal of the shift register unit is connected to a reset terminal of the shift register unit in the previous stage with two stages therebetween (i.e., the shift register unit in the (N−3)th stage), the reset terminal of the shift register unit is connected to a reset signal output terminal of the shift register unit in a next stage with two stages therebetween (i.e., the shift register unit in the (N+3)th stage), and the output terminal of the shift register unit is connected to an Nth gate line GL(N). In the five periods indicated by a, b, c, d, and e illustrated in FIG. 5, the shift register unit performs the following operations:

In a first period a, a low level clock signal CK is inputted to the first clock signal terminal, a high level clock signal CKB is inputted to the second clock signal terminal, and a high level active input signal is connected to the input terminal INPUT; since a high level is inputted to the input terminal, the transistor M1 is turned on, so that the high level input signal charges the pull-up node PU; since the clock signal CKB is at a high level, the transistor M5 is turned on, so that the output terminal of the shift register unit is pulled down to a low level VSS, which eliminates the noise in the output of the shift register unit; the transistor M7 is turned on to charge the pull-down control node PD_CN, so that the transistor M9 is turned on; since the pull-up node PU is at the first high level, the transistors M8 and M10 are turned on; in the design of transistors, a size ratio of the transistors M8 and M7 can be configured in such a way that when M8 and M7 are both turned on, a level at the pull-down control node PD_CN is pulled down to a low level; likewise, a size ratio of the transistor M10 and M9 can be configured in such a way that when M10 and M9 are both turned on, a level at the pull-down node PD is pulled down to a low level, thus ensuring that the transistors M4 and M6 are in a turned-off state in this period;

In a second period b, a high level clock signal CK is inputted to the first clock signal terminal, a low level clock signal CKB is inputted to the second clock signal terminal, and a low level input signal is connected to the input terminal INPUT; the transistors M1, M7, and M5 are turned off; since CK is at a high level, the transistor M1 is turned on to pull down the pull-down control node PD_CN to VSS, and the transistor M9 is turned off; the output transistor M2 is turned on to output a high level clock signal CK, so as to output a driving signal to the corresponding gate line; because of bootstrap effect of the storage capacitor C1, a level at the pull-up node PU is further increased to a second high level, so that the output transistor M2 is turned on more fully; since the pull-up node PU is at a high level, the transistors M8 and M10 continue to be turned on, and the pull-down control node PD_CN and the pull-down node PD are pulled down to VSS, respectively; since the pull-down node PD is at a low level, the transistors M4 and M6 are maintained in a turned-off state, so as not to affect the normal output of a shift signal from the shift register unit; meanwhile, since the pull-up node is at a high level, the trigger transistor M12 is turned on, to output a trigger signal to the output terminal of the shift register unit in an (N+2)th stage; and the reset signal transistor M13 supplies a reset signal to the reset terminal of the shift register unit in an (N−3)th stage under control of the pull-up node that is at a high level.

In a third stage c, a low level clock signal CK is inputted to the first clock signal terminal, a high level clock signal CKB is inputted to the second clock signal terminal, a low level continues to be connected to the input terminal INPUT, the transistor M1 continues to be maintained off, the transistor M5 is turned on under control of the CKB that is at a high level, so that the output terminal of the shift register unit is pulled down to VSS, which eliminates the noise in the output of the shift register unit; the transistor M11 is turned off under control of the CK that is at a low level; the transistor M7 is turned on under control of CKB that is at a high level to charge the pull-down control node PD_CN, so that the transistor M9 is turned on to charge the pull-down node PD; in this case, since the signal connected to the reset signal terminal is still at a low level, the reset transistor M3 is not turned on, and the pull-up node PU is not pulled down to the low level VSS, and the output transistor M2 is maintained on; since the clock signal CK is changed from a high level to a low level, the output transistor M2 outputs the clock signal CK that is at a low level to the output terminal; due to the coupling effect of the capacitor C1, the level at the pull-up node PU is decreased from the second high level to the first high level, and is maintained at the first high level; since the pull-up node PU is maintained at the first high level, the transistors M8 and M10 are turned on; according to the size ratio of the transistors M8 and M7, when the transistor M8 and M7 are both turned on, the level at the pull-down control node PD_CN is pulled down to a low level; likewise, according to the size ratio of the transistors M10 and M9, when the transistor M10 and M9 are both turned on, the level at the pull-down node PI) is pulled down to a low level, so as to ensure that the transistors M4 and M6 are in a turned-off state in this period.

In a fourth period d, still, a low level clock signal CK is still inputted to the first clock signal terminal, a high level clock signal CKB is inputted to the second clock signal terminal, and a low level continues to be connected to the input terminal INPUT, so that the transistor M1 continues to be maintained off, and the transistor M5 is maintained on under control of CKB that is at a high level, so that the output terminal of the shift register unit is pulled down to VSS, which eliminates the noise at the output of the shift register unit; the transistor M11 is maintained off under control of CK that is at a low level; the transistor M7 is maintained on under control of CKB that is at a high level, and the transistor M9 is maintained on; since the signal connected to the reset signal terminal is changed from a low level to a high level, the reset transistor M3 is turned on, to pull down the pull-up node PU from the first high level to the low level VSS, so that the output transistor M2 is turned off; since the pull-up node PU is pulled down to the VSS that is at a low level, the transistor M8 and M10 are turned off; since the transistors M7 and M9 are maintained on, the CKB signal that is at a high level charges the pull-down control node PD_CN and the pull-down node PD, so that the pull-down node PD is changed to a high level, and the transistors M4 and M6 are turned on, so as to pull down the pull-up node PU and the output terminal of the shift register unit to VSS, respectively, which eliminates the noise that might be generated at the output terminal and the pull-up node of the shift register unit.

In a fifth period e, a high level clock signal CK is inputted to the first clock signal terminal, a low level clock signal CKB is inputted to the second clock signal terminal, a low level continues to be connected to the input terminal INPUT, and a high level is connected to the reset terminal; the transistors M1, M7, M9, and M5 are turned off; since CK is at a high level, the transistor M11 is turned on, and the pull-down control node PD_CN is pulled down to VSS; since the pull-up node PU is maintained at a low level, the transistors M8 and M10 continue to be turned off, the pull-down node PD is maintained at a high level, so that the transistors M4 and M6 are turned on, and the pull-up node and the output terminal of the shift register unit are pulled down to the low level VSS, respectively, which eliminates the noise that might be generated at the output terminal and the pull-up node of the shift register unit in a non-output period.

In a sixth period f the clock signal CK at a high level continues to be inputted to the first clock signal terminal, the clock signal CKB at a low level continues to be inputted to the second clock signal terminal, a low level continues to be connected to the input terminal INPUT, and a low level is connected to the reset terminal; the transistors M1, M7, M9, M5, M3 are tuned off; since CK is at a high level, so that the transistor M11 is maintained on, and the pull-down control node PD_CN is maintained at the previous low level VSS; the pull-up node PU is maintained at the previous low level, and the transistors M8 and M10 are maintained off; the pull-down node PD is maintained at the previous high level, and the transistors M4 and M6 are turned on to pull down the pull-up node PU and the output terminal of the shift register unit to the low level VSS, which further eliminates the noise that might be generated at the output terminal and the pull-up node of the shift register unit in a non-output period.

Optionally, before the shift register unit performs the operations in the first period, firstly, a high level pulse signal is supplied to the initialization signal terminal STV of the shift register unit in a current stage, so as to turn on the transistor M14, so that a level at the pull-up node PU is initialized to a low level VSS.

In the shift register unit according to the embodiment of the present disclosure as illustrated in FIG. 4, the pull-down transistor M4 and the input transistor M13 in the shift register unit illustrated in FIG. 1 are removed, the area occupied by the large-size transistor M4 is reduced, which facilitates miniaturizing the gate drive circuit GOA and implementing narrow bezel of the display device; meanwhile, since connection structure of related circuit is changed, the resetting of the pull-up node is delayed, and the turn-on time of the output transistor M2 is extended; thus, the low level clock signal outputted during the extended turn-on time of the output transistor M2 can be adopted to perform the pull-down control on the signal at the gate line; in addition, since the size of the output transistor is larger than that of the removed transistor, it is more efficient to use the low level CK signal outputted from the output transistor to perform the pulling-down. In addition, the transistors M12 and the transistor M13 are arranged separately to provide a trigger signal for the shift register unit in the (N+2)th stage and a reset signal for the shift register unit in the (N−3)th stage, respectively, the driving signal provided to the gate line corresponding to the shift register unit in the current stage is separated from the trigger signal provided to the shift register unit in the (N+2)th stage and/or the reset signal provided to the shift register unit in the (N−3)th stage, so that the signal delay is reduced, the signal waveform is improved, and the affect, which is due to the failure occurring in the output transistor M2 in the shift register unit in the current stage, over the entire gate driving device is decreased, enhancing the circuit reliability; meanwhile, when a failure occurs in the output transistor in the shift register unit in the current stage, it is easy to locate a point of failure according to the malfunction in the scanning of a corresponding gate line.

According to another aspect of the present disclosure, there is further provided a gate driving device. As illustrated in FIG. 6, the gate line driving device comprises a plurality of shift register units cascaded in multiple stages, wherein the shift register unit in each stage can adopt the structure of the shift register unit illustrated in FIGS. 3 and 4. As illustrated in FIG. 6, an output terminal of the shift register unit in each stage is connected to one corresponding gate line; wherein the first clock signal terminal and the second clock signal terminal of the shift register unit in an odd-numbered stage are connected to the first clock signal CK and the second clock signal CKB, respectively; the trigger signal output terminal TRIG-OUT of the shift register unit in the odd-numbered stage is connected to an input terminal INPUT of the shift register unit in a next odd-numbered stage with one stage therebetween, the reset signal output terminal RESET-OUT of the shift register unit in the odd-numbered stage is connected to a reset terminal RESET-IN of the shift register unit in a previous even-numbered stage with two stages therebetween; the first clock signal terminal and the second clock signal terminal of the shift register unit in an even-numbered stage are connected to the third clock signal CK' and the fourth clock signal CKB', respectively; the trigger signal output terminal TRIG-OUT of the shift register unit in the even-numbered stage is connected to the input terminal INPUT of the next shift register unit in the even-numbered stage with one stage therebetween; the reset signal output terminal RESET-OUT of the shift register unit in the even-numbered stage is connected to the reset terminal RESET-IN of the shift register unit in odd-numbered stage with two stages therebetween. Periods of the first clock signal, the second clock signal, the third clock signal, and the fourth clock signal are the same, the timing of the first clock signal and that of second clock signal are opposite, and the timing of the third clock signal and that of the fourth clock signal are opposite, and the third clock signal lags behind the first clock signal by a quarter of the period. As illustrated in FIG. 6, taking the shift register unit in the Nth stage as an example, the output terminal OUTPUT of the shift register unit in the Nth stage is connected to the Nth gate line GL (N), the input terminal of the shift register unit in the Nth stage is connected to the trigger signal output terminal TRIG-OUT of the shift register unit in the (N−2)th stage; the trigger signal terminal TRIG-OUT of the Nth stage shift register unit is connected to the input terminal INPUT of the shift register unit in the (N+2)th stage, the reset signal output terminal RESET-OUT of the stage shift register unit in the Nth stage is connected to the reset terminal RESET-IN of the shift register in the (N−3)th stage, and the reset terminal RESET-IN of the Nth stage shift register unit is connected to the reset signal output terminal RESET-OUT of the shift register unit in the (N+3)th stage.

In the gate line driving device according to the present disclosure as described above, since the connection structure of the shift register unit is changed, the resetting of the pull-up node in the shift register unit is delayed, and the turn-on time of the output transistor is extended; thus, the low level clock signal outputted during the extended turn-on time of the output transistor can be adopted to perform the pull-down control on the signal at the gate line, achieving the pull-down more effectively; moreover, since the large-size transistor dedicated to pull down the output terminal is removed, it facilitates miniaturizing the gate driving device and implementing narrow bezel of the display device. In addition, a transistor to provide a trigger signal to the shift register unit in a next stage (in timing sequence) and/or a transistor to provide a reset signal to the shift register unit in a previous stage (in timing sequence) are arranged separately, the driving signal provided to the gate line corresponding to the shift register unit in the current stage is separated from the trigger signal provided to the shift register unit in the next stage and/or a reset signal provided to the shift register unit in the previous stage, so that the signal delay is reduced, the signal waveform is improved, and the affect, which is due to the failure occurring in the output transistor in the shift register unit in the current stage, over the entire gate driving device is decreased, enhancing the circuit reliability; meanwhile, when a failure occurs in the output transistor in the shift register unit in the current stage, it is easy to locate a point of failure according to the malfunction in the scanning of a corresponding gate line.

Figure 7:
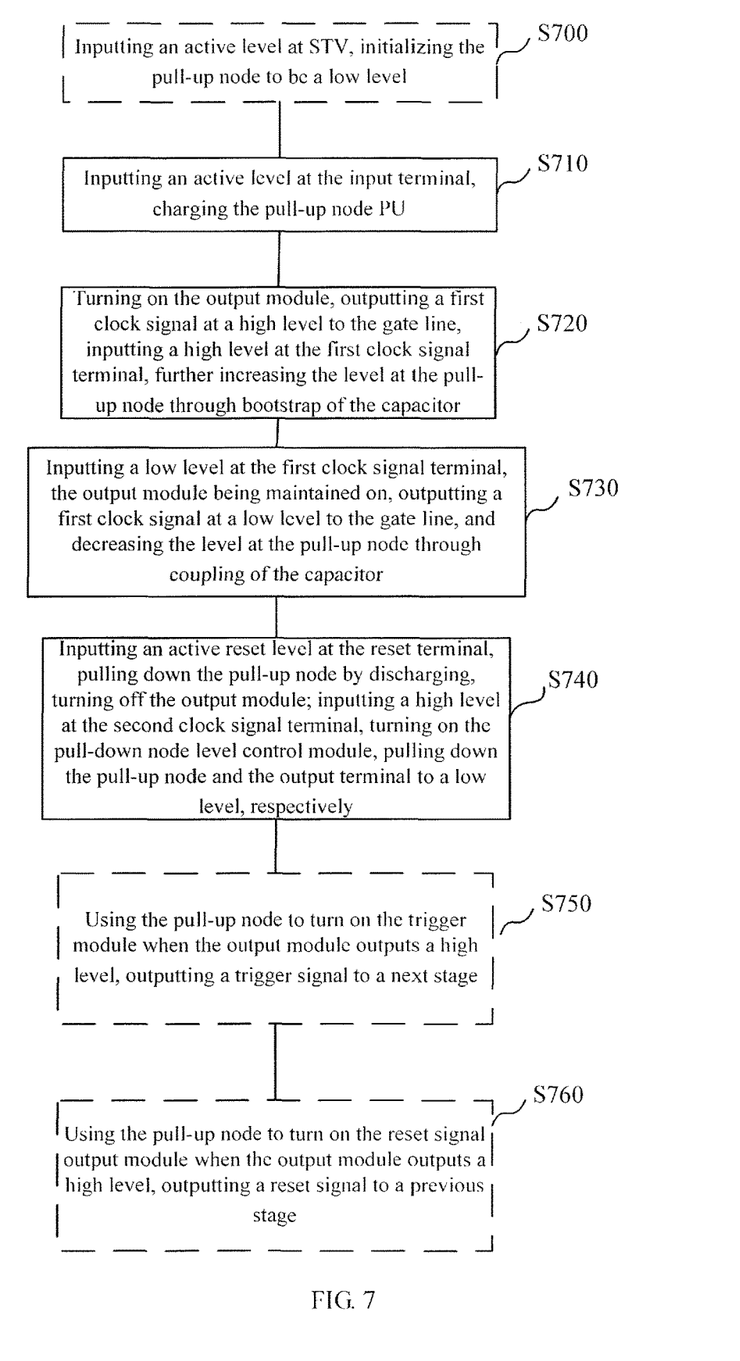
FIG. 7 a flowchart of a driving method applicable to a shift register unit according to an embodiment of the present disclosure.

According to another aspect of the present disclosure, there is further provided a method for driving and controlling the shift register unit illustrated in FIG. 3. As illustrated in FIG. 7, the method mainly comprises the following steps: S710 inputting an active level to the input terminal, and charging the pull-up node to be at a first high level; S720 inputting a high level to the first clock signal terminal, and turning on the output module, and outputting a first clock signal at a high level to a gate line, so that a level at the pull-up node is increased from the first high level to a second high level through bootstrap effect of the capacitor; S730 inputting a low level to the first clock signal terminal, and maintaining the output module to be on, and outputting a first clock signal at a low level to the gate line, so that the level at the pull-up node is decreased from the second high level to the first high level through the coupling of the capacitor; S740 inputting an active reset level to the reset terminal, discharging the pull-up node to be at a low level, and turning off the output module; and charging the pull-down node by the high level inputted from the second clock signal terminal, and turning on the pull-down node level control module to pull down the pull-up node and the output terminal to be at a low level, respectively.

Optimally, the method described above further comprises step S700, inputting an active level to an initialization signal input terminal STV, so as to initialize the pull-up node to be at a low level.

Optionally, the method described above further comprises step S750, turning on the trigger module by the pull-up node when the output module is turned on to output a first clock signal at a high level to a gate line, so as to output a trigger signal to the shift register unit in a next stage.

Optionally, the method described above further comprises step S760, turning on the reset signal output module by the pull-up node when the output module is turned on to output a first clock signal at a high level to the gate line, so as to output a reset signal to the shift register unit in a previous stage.

Optionally, step S710 comprises: inputting a high level to the input terminal, and turning on the first transistor M1 to charge the pull-up node PU to be at a first high level.

Optionally, step S720 comprises: turning on the transistor M2 by the high level at the pull-up node PU, so that the transistor M2 outputs to the gate line a first clock signal at a high level, and the level at the pull-up node is further increased to a second high level through bootstrap effect of the capacitor C1.

Optionally, step S730 comprises: inputting a low level to the first clock signal terminal, and maintaining the transistor M2 on, so that the first clock signal at a low level is output to the gate line, and the level at the pull-up node is decreased to the first high level from the second high level through coupling effect of the capacitor C1.

Optionally, step S740 comprises: turning on the transistor M3 with the active reset level inputted from the reset terminal, and pulling down the pull-up node to be at the low level VSS, so that the transistor M2 is turned off; turning on the transistors M7 and M9 with the high level inputted from the second clock signal terminal, and pulling up the pull-down node PD to a high level, so that the transistors M4 and M6 are turned on and the pull-up node PU and the output terminal are pulled down.

Optionally, step S700 comprises: inputting an active level to the initialization signal input terminal STV, and turning on the transistor M14, so as to initialize the pull-up node to be at the low level VSS Optionally, step S750 comprises: turning on the trigger transistor M12 with the high level at the pull-up node when the transistor M2 is turned on, so as to output a trigger signal to the shift register unit in a next stage.

Optionally, step S760 comprises: turning on the transistor M13 with the high level at the pull-up node when the transistor M2 is turned on, so as to output a reset signal to the shift register unit in a previous stage.

In the driving method for the shift register unit according to an embodiment of the present disclosure, the resetting of the pull-up node is delayed, and the turn-on time of the output transistor M2 is extended; thus, the low level clock signal outputted during the extended turn-on time of the output transistor can be adopted to perform the pull-down control on the signal at the gate line, removing the large-size transistor dedicated to pull down the output terminal; the driving signal provided to the gate line corresponding to the shift register unit in the current stage is separated from the trigger signal provided to the shift register unit in the next stage and/or a reset signal provided to the shift register unit in the previous stage, so that the signal delay is reduced, the signal waveform is improved, and the affect, which is due to the failure occurring in the output transistor M2 in the shift register unit in the current stage, over the entire gate driving device is decreased, enhancing the circuit reliability; meanwhile, when a failure occurs in the output transistor M2 in the shift register unit in the current stage, it is easy to locate a point of failure according to the malfunction in the scanning of a corresponding gate line.

The above described are merely specific implementations of the present disclosure, but the protection scope of the present disclosure is not limited thereto, modification and replacements easily conceivable for those skilled in the art within the technical range revealed by the present disclosure all fall into the protection scope of the present disclosure. Therefore, the protection scope of the present disclosure should be determined based on the protection scope of the claims.

The present application claims priority of the Chinese Patent Application No. 201510647045.2 filed on Oct. 8, 2015, the entire disclosure of which is hereby incorporated in full text by reference as part of the present application.

What is claimed is:

1. A shift register unit, comprising:
an input module connected between an input terminal and a pull-up node, and configured to charge the pull-up node when a trigger signal from a previous stage is received at the input terminal;
an output module connected between the pull-up node, a first clock signal terminal and an output terminal, and configured to output to the output terminal a first clock signal received at the first clock signal terminal under control of the pull-up node;
a pull-up node reset module connected between a reset terminal, a pull-down node and the pull-up node, and configured to reset the pull-up node under control of a reset signal inputted at the reset terminal or a level at the pull-down node;
an output reset module connected between a second clock signal terminal, the pull-down node and the output terminal, and configured to reset the output terminal under control of a second clock signal received at the second clock signal terminal or a level at the pull-down node; and
a pull-down node level control module connected between the first clock signal terminal, the second clock signal terminal, the pull-down node and the pull-up node, and configured to control a level at the pull-down node under control of at least one of the first clock signal received at the first clock signal terminal, the second clock signal received at the second clock signal terminal, and a level at the pull-up node,
wherein the pull-down node level control module comprises:
a seventh transistor having a control electrode connected to a first electrode thereof and further connected to the second clock signal terminal;
an eighth transistor having a control electrode connected to the pull-up node, a first electrode connected to a second level input terminal, and a second electrode connected to a second electrode of the seventh transistor;
a ninth transistor having a control electrode connected to the second electrode of the seventh transistor, a first electrode connected to the second clock signal terminal, and a second electrode connected to the pull-down node;
a tenth transistor having a control electrode connected to the pull-up node, a first electrode connected to the pull-down node, and a second electrode connected to the second level input terminal; and
an eleventh transistor having a control electrode connected to the first clock signal terminal, a first electrode connected to the second level input terminal, and a second electrode connected to a gate of the ninth transistor.

2. The shift register unit according to claim 1, further comprising:
a trigger module connected between the pull-up node and the first clock signal terminal, and configured to provide a trigger signal to a shift register unit in a next stage.

3. The shift register unit according to claim 2, wherein the trigger module comprises:

a twelfth transistor having a control electrode connected to the pull-up node, a first electrode connected to the first clock signal terminal, and a second electrode connected to a trigger signal output terminal.

4. The shift register unit according to claim 1, further comprising:
a reset signal output module connected between the pull-up node and the first clock signal terminal, and configured to provide a reset signal to a shift register unit in a previous stage.

5. The shift register unit according to claim 4, wherein the reset signal output control module comprises:
a thirteenth transistor having a control electrode connected to the pull-up node, a first electrode connected to the first clock signal terminal, and a second electrode connected to the reset signal output terminal.

6. The shift register unit according to claim 1, further comprising:
an initialization module connected between an initial signal input terminal and the pull-up node, and configured to initialize a level at the pull-up node.

7. The shift register unit according to claim 6, wherein the initialization module comprises:
a fourteenth transistor having a control electrode connected to the initial signal input terminal, a first electrode connected to the pull-up node, and a second electrode connected to the second level input terminal.

8. The shift register unit according to claim 1, wherein the input module comprises:
a first transistor having a control electrode connected to the input terminal, a first electrode connected to a first level input terminal, and a second electrode connected to the pull-up node.

9. The shift register unit according to claim 1, wherein the output module comprises:
a second transistor having a control electrode connected to the pull-up node, a first electrode connected to the first clock signal terminal, and a second electrode connected to the output terminal; and
a capacitor connected in parallel with a gate and a source of the second transistor.

10. The shift register unit according to claim 1, wherein the pull-up node reset module comprises:
a third transistor having a control electrode connected to the reset terminal, a first electrode connected to the pull-up node, and a second electrode connected to the second level input terminal; and
a fourth transistor having a control electrode connected to the pull-down node, a first electrode connected to the pull-up node, and a second electrode connected to the second level input terminal.

11. The shift register unit according to claim 1, wherein the output reset module comprises:
a fifth transistor having a control electrode connected to the second clock signal terminal, a first electrode connected to the output terminal, and a second electrode connected to the second level input terminal, and
a sixth transistor having a control electrode connected to the pull-down node, a first electrode connected to the output terminal, and a second electrode connected to the second level input terminal.

12. A gate line driving device, comprising a plurality of the shift register units of claim 1 cascaded in multiple stages, wherein an output terminal of the shift register unit in each stage is connected to one corresponding gate line;
wherein the first clock signal terminal and the second clock signal terminal of the shift register unit in an Nth stage are connected to the first clock signal and the second clock signal, respectively; a trigger signal output terminal of the Nth stage shift register unit is connected to the input terminal of the shift register unit in the (N+2)th stage, a reset signal output terminal of the stage shift register unit in the Nth stage is connected to the reset terminal of the shift register in the (N−3)th stage, and the reset terminal of the shift register unit in the Nth stage is connected to the reset signal output terminal of the shift register unit in the (N+3)th stage; the first clock signal terminal and the second clock signal terminal of the shift register unit in (N−1)th stage are connected to a third clock signal and a fourth clock signal, respectively;

wherein periods of the first clock signal, the second clock signal, the third clock signal, and the fourth clock signal are the same, a timing of the first clock signal and that of second clock signal are opposite, and the timing of the third clock signal and that of the fourth clock signal are opposite, and the third clock signal lags behind the first clock signal by a quarter of the period.

13. The gate line driving device according to claim 12, wherein each of the shift register units further comprises:
a trigger module connected between the pull-up node and the first clock signal terminal, and configured to provide a trigger signal to a shift register unit in a next stage.

14. The gate line driving device according to claim 12, wherein each of the shift register units further comprises:
a reset signal output module connected between the pull-up node and the first clock signal terminal, and configured to provide a reset signal to a shift register unit in a previous stage.

15. The gate line driving device according to claim 12, wherein each of the shift register units further comprises:
an initialization module connected between an initial signal input terminal and the pull-up node, and configured to initialize a level at the pull-up node.

16. A driving method for being applied to the shift register unit according to claim 1, comprising:
inputting an active level to the input terminal, turning on the input module, charging the pull-up node to be a first level, and turning on the output module by the first level at the pull-up node;
inputting an active level to the first clock signal terminal, outputting a gate line turn-on voltage to a gate line connected to the output terminal by the output module that is turned on, and changing the pull-up node from the first level to the second level;
inputting an inactive level to the first clock signal terminal, maintaining the output module to be on, so as to output a gate line turn-off voltage to the gate line connected to the output terminal and to change the pull-up node from the second level to the first level;
inputting an active level to the reset terminal, turning on the pull-up node reset module, changing a level at the pull-up node to an inactive level, thereby turning off the output module; and
charging the pull-down node by the active level inputted from the second clock signal terminal, turning on the output reset module by the active level at the pull-down node and maintaining the pull-up node reset module to be on, so as to maintain the output terminal and the pull-up node to be at the inactive level.

* * * * *